United States Patent
Shimizu et al.

[11] Patent Number: 6,049,238
[45] Date of Patent: Apr. 11, 2000

[54] CLOCK GENERATOR AND CLOCK GENERATING METHOD CAPABLE OF VARYING CLOCK FREQUENCY WITHOUT INCREASING THE NUMBER OF DELAY ELEMENTS

[75] Inventors: Kazuyoshi Shimizu; Kouichi Ishimi; Katsunori Sawai, all of Tokyo, Japan

[73] Assignee: Mitsubishi Denki Kabushiki Kaisha, Tokyo, Japan

[21] Appl. No.: 09/178,580

[22] Filed: Oct. 26, 1998

[30] Foreign Application Priority Data

May 12, 1998 [JP] Japan .................................. 10-129318

[51] Int. Cl.⁷ ...................................................... H03L 7/08
[52] U.S. Cl. ............................ 327/156; 327/115; 327/116
[58] Field of Search ..................................... 327/147–153, 327/156–159, 161, 117, 116, 119

[56] References Cited

U.S. PATENT DOCUMENTS 5,896,428  4/1999  Yamagiuchi ............................. 327/159

FOREIGN PATENT DOCUMENTS 4-12842      3/1992  Japan .
WO85/02275   5/1985  WIPO .

OTHER PUBLICATIONS

Technical Report of the Institute of Electronics, Information and Communication Engineers of Japan, vol. 97, No. 106, pp. 29–36, Jun. 1997.

*Primary Examiner*—Tuan T. Lam
*Attorney, Agent, or Firm*—Burns, Doane, Swecker & Mathis, LLP

[57] ABSTRACT

A clock generator including a frequency multiplier, a phase lock circuit and a frequency divider. The frequency multiplier generates a frequency multiplied clock by multiplying the frequency of an input clock. The phase lock circuit detects a phase difference between the input clock and a frequency divided clock, and generates, by delaying the frequency multiplied clock by an amount corresponding to the phase difference, a phase-locked clock with its phase locked with the input clock. The frequency divider detects in every fixed cycle a particular pulse of the phase-locked clock, and generates the frequency divided clock by dividing the phase-locked clock with reference to the particular pulse of the phase-locked clock. In particular, the frequency divider detects the particular pulse immediately previous to a falling edge of the input clock. This can reduce the phase difference between the input clock and the phase-locked clock, and hence to solve a problem of a conventional clock generator in that a delay time of a digital delay line in a phase lock circuit must be lengthened with a reduction in the multiplication number of the frequency multiplied clock, which requires a greater number of delay elements because of a large occupying area of the delay elements and a decoder, thereby increasing the circuit scale and cost of a chip to reduce the multiplication number of the frequency multiplied clock.

14 Claims, 10 Drawing Sheets

TRANSISTORS

TRANSISTORS

TRANSISTORS WITH
LONG GATE LENGTH
OR WITH NARROW
GATE WIDTH

CLOCK GENERATOR AND CLOCK GENERATING METHOD CAPABLE OF VARYING CLOCK FREQUENCY WITHOUT INCREASING THE NUMBER OF DELAY ELEMENTS

BACKGROUND OF THE INVENTION

1. Field of the Invention

The present invention relates to a clock generator and a clock generating method for generating a frequency divided clock signal with the same period as an input clock signal or frequency multiplied clock signal.

2. Description of Related Art

FIG. 10 shows a configuration of a conventional clock generator disclosed in Technical report of the Institute of electronics, information and communication engineers of Japan, pp. 29–36, Vol. 97, No. 106, published June, 1997, which is incorporated here by reference. In FIG. 10, the reference numeral 1 designates a frequency multiplier for generating a frequency multiplied clock signal by frequency multiplying an input clock signal; 2 designates a ring oscillator consisting of a digital delay line 3 for delaying the frequency multiplied clock signal; 3 designates the digital delay line of the ring oscillator 2; 4 designates a counter for setting a delay time of the digital delay line 3; 5 designates a phase comparator for comparing the phase of the input clock signal with that of a feedback clock signal output from a driver 9, and updates the counter value of a counter 7 in accordance with the phase difference; 6 designates a phase lock circuit for synchronizing the phase of the feedback clock signal with that of the input clock signal by delaying the frequency multiplied clock signal generated, and produces the delayed frequency multiplied clock signal as a PLL (phase-locked loop) output; 7 designates the counter of the phase lock circuit 6; 8 designates a digital delay line for delaying the frequency multiplied clock signal generated by the frequency multiplier 1 by a delay time corresponding to the counter value, the digital delay line 8 being composed of a plurality of delay elements and a decoder. The reference numeral 9 designates the driver for supplying the phase comparator 5 with the PLL output as the feedback clock signal; and each reference numeral 10 designates a driver for delivering to respective blocks the PLL output produced by the phase lock circuit 6.

Next, the operation of the conventional clock generator will be described.

First, the clock generator, which will be called "PLL (phase-locked loop)" from now on, generates a clock signal with the same cycle as the input clock signal or a frequency multiplied clock signal thereof, both of which are synchronized with the input clock signal. It is essential for modern microprocessors to include a PLL because they operate at a very high frequency in a range from a few tens to several hundred megahertz.

Conventional PLLs are an analog type PLL that controls its oscillation frequency by controlling with a charge pump the voltage of a capacitor which holds the control voltage of a voltage controlled oscillator (VCO).

The analog PLL, however, has problems of being not easy to control at a low voltage, susceptible to noise, and requiring a rather long time to re-operate once it has suspended its oscillation in response to the halt of the input clock signal, because it takes a long time (lock time) until its operation becomes stable.

To solve these problems, the conventional example as shown in FIG. 10 employs the digital delay lines to construct the PLL. More specifically, when the PLL receives the input clock signal, the digital delay line 3 of the frequency multiplier 1 multiplies the frequency of the input clock signal, and supplies it to respective blocks. Since the frequency multiplied clock signal, which is generated as the PLL output, must be synchronized with the input clock signal in their phases, the phase comparator 5 and phase lock circuit 6 carry out the following phase locking processing.

First, the phase comparator 5 compares the phase of the frequency multiplied clock signal which is generated by the frequency multiplier 1 with that of the feedback clock signal (corresponding to the PLL output) which is output from the driver 9, and makes a decision as to whether the phase difference is within an acceptable range.

If the phase difference is in the acceptable range, the phase lock circuit 6 decides that the phase of the frequency multiplied clock signal agrees with that of the input clock signal, and maintains the counter value of the counter 7 in the phase lock circuit 6, thereby keeping the delay time of the phase lock circuit 6. On the contrary, if the phase difference is out of the acceptable range, the phase lock circuit 6 judges that the phase of the frequency multiplied clock signal disagrees with that of the input clock signal, and updates (that is, increments or decrements) the counter value of the counter 7 in accordance with the phase difference, thereby controlling the delay time of the phase lock circuit 6.

When the counter value of the counter 7 is set in this way, the digital delay line 8 in the phase lock circuit 6 delays the frequency multiplied clock signal in accordance with the counter value of the counter 7, and supplies the delayed frequency multiplied clock signal to the drivers 9 and 10 as the PLL output. In this case, the digital delay line 8 delays the rising edge of a pulse of the frequency multiplied clock signal, which is immediately previous to the rising edge of each pulse of the input clock signal as shown in FIG. 11, so that the rising edge of the corresponding pulse of the feedback clock signal is synchronized with the rising edge of each pulse of the input clock signal.

Accordingly, the maximum delay time of the digital delay line 8 corresponds to one cycle of the frequency multiplied clock signal, and that of the digital delay line 3 constituting the ring oscillator 2 of the frequency multiplier 1 corresponds to half the cycle of the frequency multiplied clock signal.

Thus, the maximum delay time of the digital delay line 8 depends on the period of the frequency multiplied clock signal. For example, to generate the PLL output with a multiplication number of one (that is, the PLL output with a period equal to the period of the input clock signal) in order to save power, the maximum delay time of the digital delay line 8 becomes equal to the period of the PLL output. Therefore, the number of delay elements of the digital delay line 8 required in this case becomes four times that required when the multiplication number is four as illustrated in FIG. 11.

With such an arrangement, the conventional clock generator must lengthen the maximum delay time of the digital delay line 8 by an amount corresponding to the reduction in the multiplication number of the frequency multiplied clock signal, which requires an increasing number of delay elements and a decoder. Since the delay elements and the decoder occupy a rather large area, the reduction of the multiplication number of the frequency multiplied clock signal presents a problem of increasing the scale of the circuit, incurring an increase in the cost of the chip in some cases.

Furthermore, since the multiplication number of the frequency multiplied clock signal is usually fixed, it cannot be easily changed once the chip has been built.

SUMMARY OF THE INVENTION

The present invention is implemented to solve the foregoing problems. It is therefore an object of the present invention to provide a clock generator and a clock generating method capable of reducing the frequency (multiplication number) of the output clock signal without increasing the number of the delay elements.

Another object of the present invention is to provide a clock generator and a clock generating method capable of changing the frequency of the output clock signal as needed.

According to a first aspect of the present invention, there is provided a clock generator comprising: a frequency multiplier for generating a frequency multiplied clock signal by multiplying a frequency of an input clock signal; a phase lock circuit for detecting a phase difference between the input clock signal and a frequency divided clock signal, and for generating, by delaying the frequency multiplied clock signal by an amount corresponding to the phase difference, a phase-locked clock signal with its phase locked with the input clock signal; and a frequency divider for detecting in a fixed cycle a particular pulse of the phase-locked clock signal, and for generating the frequency divided clock signal by dividing frequency of the phase-locked clock signal with reference to the particular pulse of the phase-locked clock signal.

Here, the frequency divider may the particular pulse at every one or more cycles of the input clock signal, and the particular pulse of the phase-locked clock signal may be a pulse immediately previous to a falling edge of the input clock signal.

The frequency divider may comprise a frequency dividing circuit for dividing the frequency of the phase-locked clock signal, and a delay circuit for providing the phase-locked clock signal with a delay of the frequency dividing circuit.

The frequency divider may comprise a selector for selecting, as an output of the frequency divider, one of the frequency divided clock signal generated by the frequency dividing circuit and the phase-locked clock signal with its phase delayed by the delay circuit.

The frequency multiplier may switch a multiplication number of the frequency multiplied clock signal in response to a multiplication number switching signal.

The frequency multiplier may comprise: a ring oscillator for generating the frequency multiplied clock signal; a counter for counting a number of pulses of the frequency multiplied clock signal; and a halt circuit for suspending generation of the frequency multiplied clock signal by the ring oscillator when the number of pulses of the frequency multiplied clock signal counted by the counter agrees with the multiplication number.

The frequency multiplier may generate an n-multiplied clock signal as the frequency multiplied clock signal, and the frequency divider may divide the n-multiplied clock signal by m, where n and m are natural numbers greater than one.

The ring oscillator may control its delay time using a digital delay line including one or more transistors with their current variable by changing their gate voltage.

The ring oscillator may controls its delay time using a digital delay line including one or more transistors with their current variable by changing their backgate voltage.

The phase lock circuit may control its delay time using a digital delay line including one or more transistors with their current variable by changing their gate voltage.

The phase lock circuit may control its delay time using a digital delay line including one or more transistors with their current variable by changing their backgate voltage.

According to a second aspect of the present invention, there is provided a clock generating method comprising the steps of: (a) generating a frequency multiplied clock signal by multiplying a frequency of an input clock signal; (b) detecting a phase difference between the input clock signal and a frequency divided clock signal, and generating, by delaying the frequency multiplied clock signal by an amount corresponding to the phase difference, a phase-locked clock signal with its phase-locked with the input clock signal; and (c) detecting in a fixed cycle a particular pulse of the phase-locked clock signal, and generating the frequency divided clock signal by dividing the phase-locked clock signal with reference to the particular pulse of the phase-locked clock signal.

Here, the step (c) may detect the particular pulse at every one or more cycles of the input clock signal, and the particular pulse of the phase-locked clock signal may be a pulse immediately previous to a falling edge of the input clock signal.

The step (a) may switch a multiplication number of the frequency multiplied clock signal in response to a multiplication number switching signal.

DETAILED DESCRIPTION OF THE PREFERRED EMBODIMENTS

The invention will now be described with reference to the accompanying drawings.

EMBODIMENT 1

Figure 1:
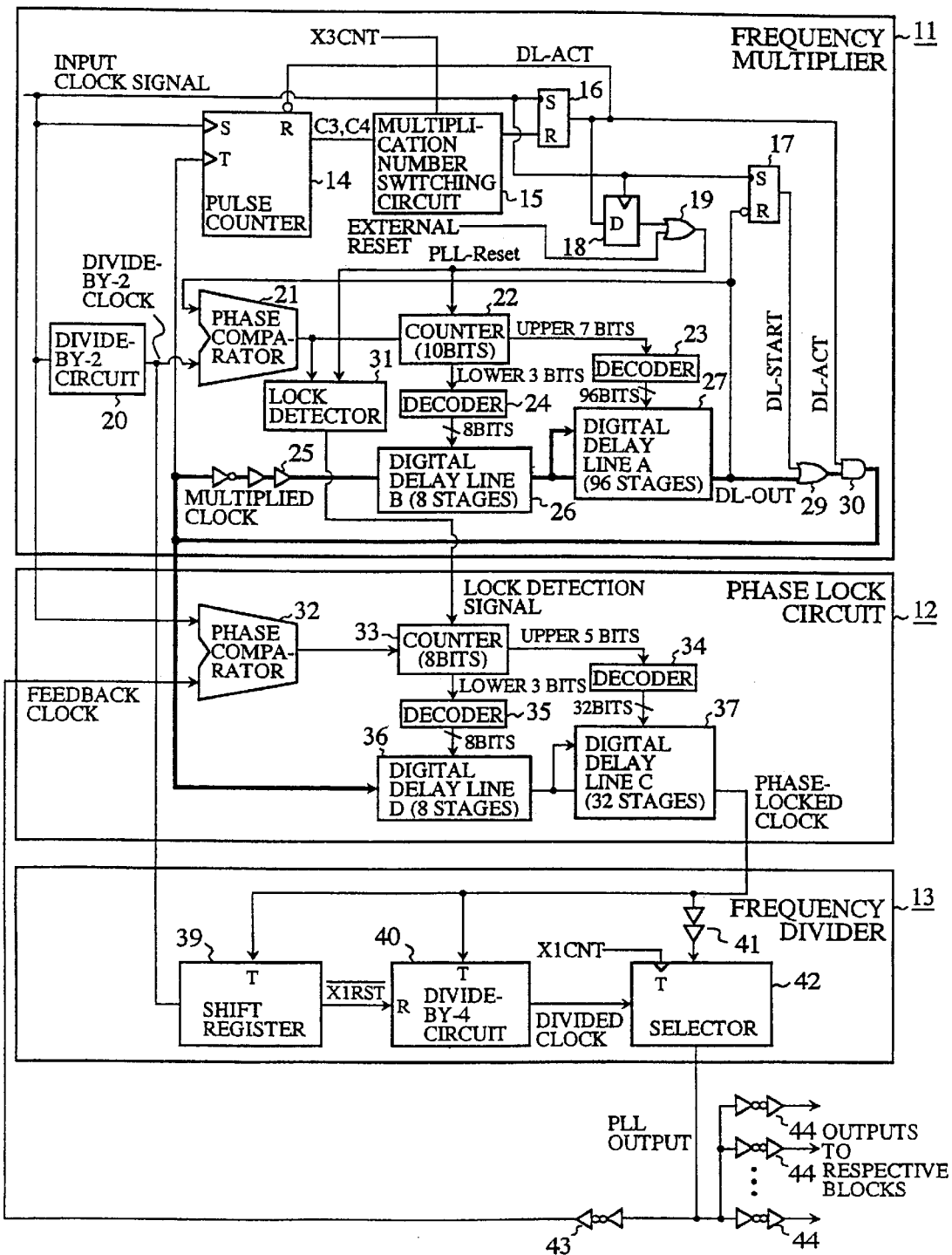
FIG. 1 is a block diagram showing an embodiment 1 of a clock generator in accordance with the present invention.

FIG. 1 is a block diagram showing an embodiment 1 of a clock generator in accordance with the present invention. In FIG. 1, the reference numeral 11 designates a frequency multiplier for generating a frequency multiplied clock signal by multiplying the frequency of an input clock signal; 12 designates a phase lock circuit for synchronizing the phase of a feedback clock signal (corresponding to a frequency divided clock signal) with that of the input clock signal by delaying the phase of the frequency multiplied clock signal generated by the frequency multiplier 11; and 13 designates a frequency divider for detecting, from among the phase-locked clock signal output from the phase lock circuit 12, a phase-locked clock pulse immediately previous to the falling edge of a pulse of the input clock signal, and for frequency dividing the phase-locked clock signal with reference to the detection point, thereby supplying the phase lock circuit 12 with the frequency divided signal or phase-locked clock signal as the feedback clock signal.

Figure 4:
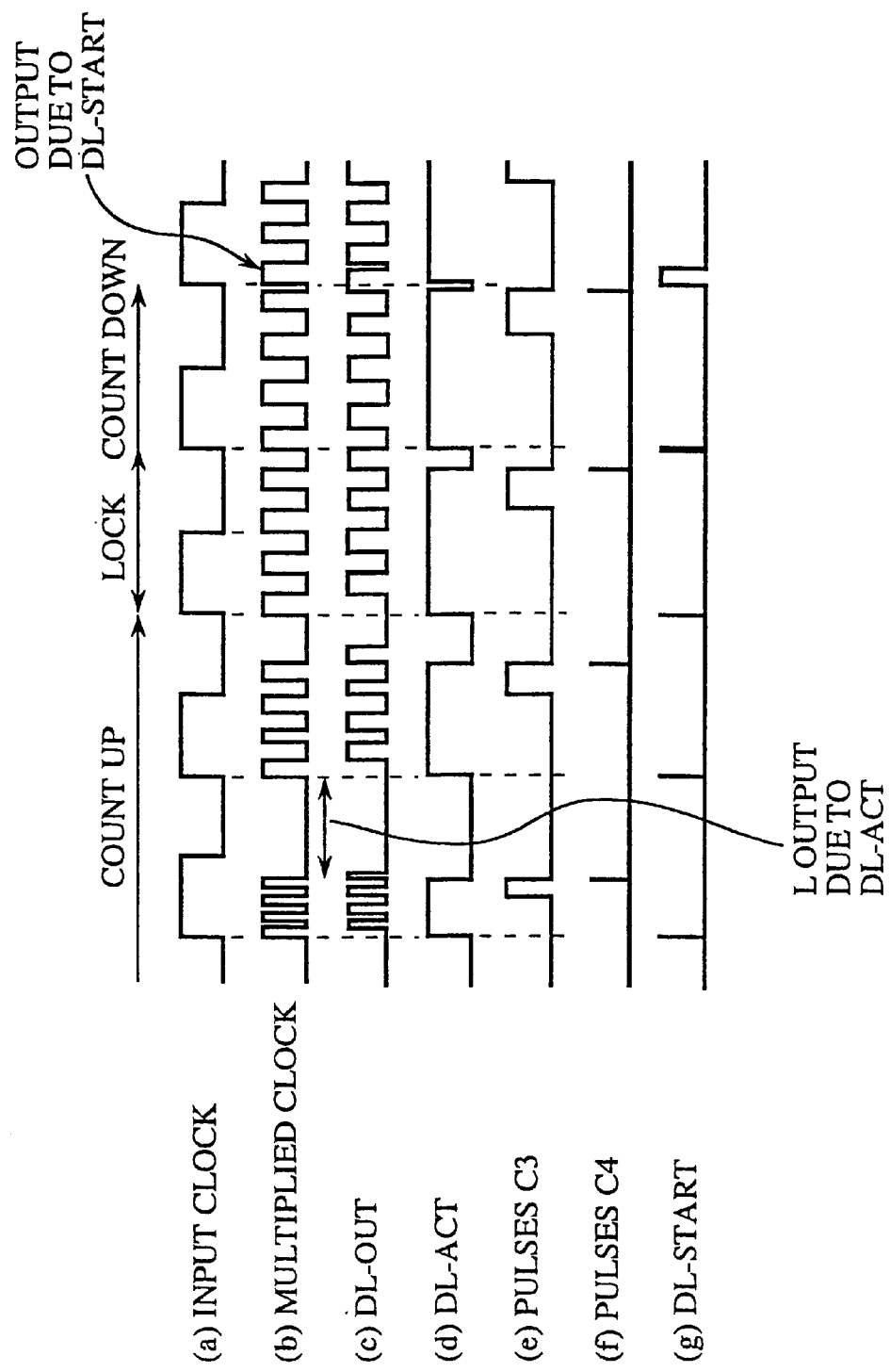
FIGS. 4a–4g are a timing chart illustrating various signals in a frequency multiplier 11 of the embodiment 1.

In the frequency multiplier 11, the reference numeral 14 designates a pulse counter for producing, when a signal DL-ACT supplied from an SR flip-flip 16 is at H (high) level, pulses C3 at third clock pulses from the rising edges of the input clock signal, and pulses C4 at fourth clock pulses therefrom as illustrated in FIG. 4; 15 designates a multiplication number switching circuit for selecting, when a multiplication number switching signal X3CNT is H level, the pulses C3 to be output, and for selecting, when the multiplication number switching signal X3CNT is L (low) level, the pulses C4 to be output; 16 designates the SR flip-flip for changing the level of the DL-ACT signal to H level upon detecting the rising edge of the input clock signal, and for shifting it to L level when the multiplication number switching circuit 15 outputs the pulses C3 or C4; 17 designates an SR flip-flop for shifting the level of a DL-START signal to H level upon detecting the rising edge of the input clock signal, and for changing it to L level when a DL-OUT signal of L level is output; 18 designates a D flip-flop for synchronizing each pulse of the DL-ACT signal output from the SR flip-flip 16 to the rising edge of the input clock signal; and 19 designates an OR gate for producing a PLL-Reset signal in response to the DL-ACT signal output from the D flip-flip 18 or to an external reset signal.

The reference numeral 20 designates a divide-by-2 circuit for halving the frequency of the input clock signal to generate a divide-by-2 clock signal; 21 designates a phase comparator for comparing the phase of the divide-by-2 clock signal generated by the divide-by-2 circuit 20 with the phase of the DL-OUT produced from digital delay line 27, and for producing, when the phase difference is out of an acceptable range, an up signal or a down signal; 22 designates a counter that resets its counter value to zero when the PLL-Reset signal is output from the OR gate 19, and increments or decrements the counter value in response to the up signal or down signal supplied from the phase comparator 21; 23 designates a decoder for decoding the upper seven bits of the counter value of the counter 22, and for outputting a 96-bit control signal; and 24 designates a decoder for decoding the lower three bits of the counter value of the counter 22, and for outputting an 8-bit control signal.

The reference numeral 25 designates fixed delay elements for delaying the frequency multiplied clock signal output from the AND gate 30; 26 designates a digital delay line for providing the frequency multiplied clock signal with a fine delay in response to the control signal output from the decoder 24; 27 designates a digital delay line for providing the frequency multiplied clock signal with a coarse delay in response to the control signal output from the decoder 23; 29 designates an OR gate 29 for forcedly placing, when the DL-START signal becomes H level, at H level the DL-OUT signal that is output from the digital delay line 27; 30 designates the AND gate for forcedly changing, when the DL-ACT signal falls to L level, the DL-OUT signal to L level to close a ring oscillator consisting of the fixed delay elements 25, the digital delay lines 26 and 27, the OR gate 29 and the AND gate 30; and 31 designates a lock detector for outputting a lock detection signal when the phase comparator 21 detects the phase synchronization, and suspends the lock detection signal when the OR gate 19 outputs the PLL-Reset signal.

In the phase lock circuit 12, the reference numeral 32 designates a phase comparator for comparing the phase of the input clock signal with that of the feedback clock signal output from a driver 43, and for producing, when the phase difference is out of an acceptable range, an up signal or a down signal; 33 designates a counter that increments or decrements its counter value in response to the up signal or down signal supplied from the phase comparator 32; 34 designates a decoder for decoding the upper five bits of the counter value of the counter 33, and for outputting a 32-bit control signal; 35 designates a decoder for decoding the lower three bits of the counter value of the counter 33, and for outputting an 8-bit control signal; 36 designates a digital delay line for providing the frequency multiplied clock signal with a fine delay in response to the control signal output from the decoder 35; and 37 designates a digital delay line for providing the frequency multiplied clock signal with a coarse delay in response to the control signal output from the decoder 34.

Figure 2:
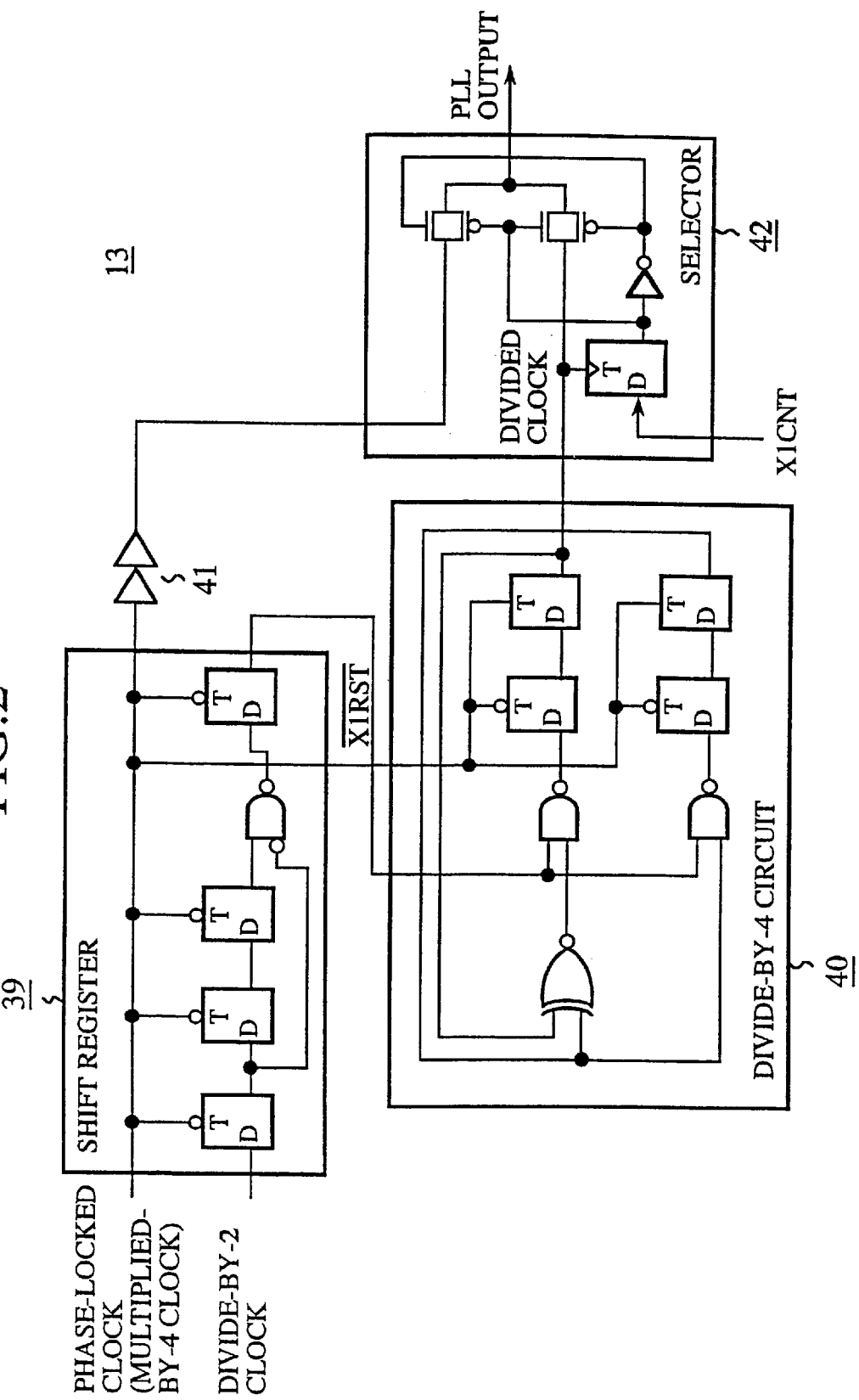
FIG. 2 is a block diagram showing a detailed configuration of a frequency divider 13 of the embodiment 1.
Figure 9:
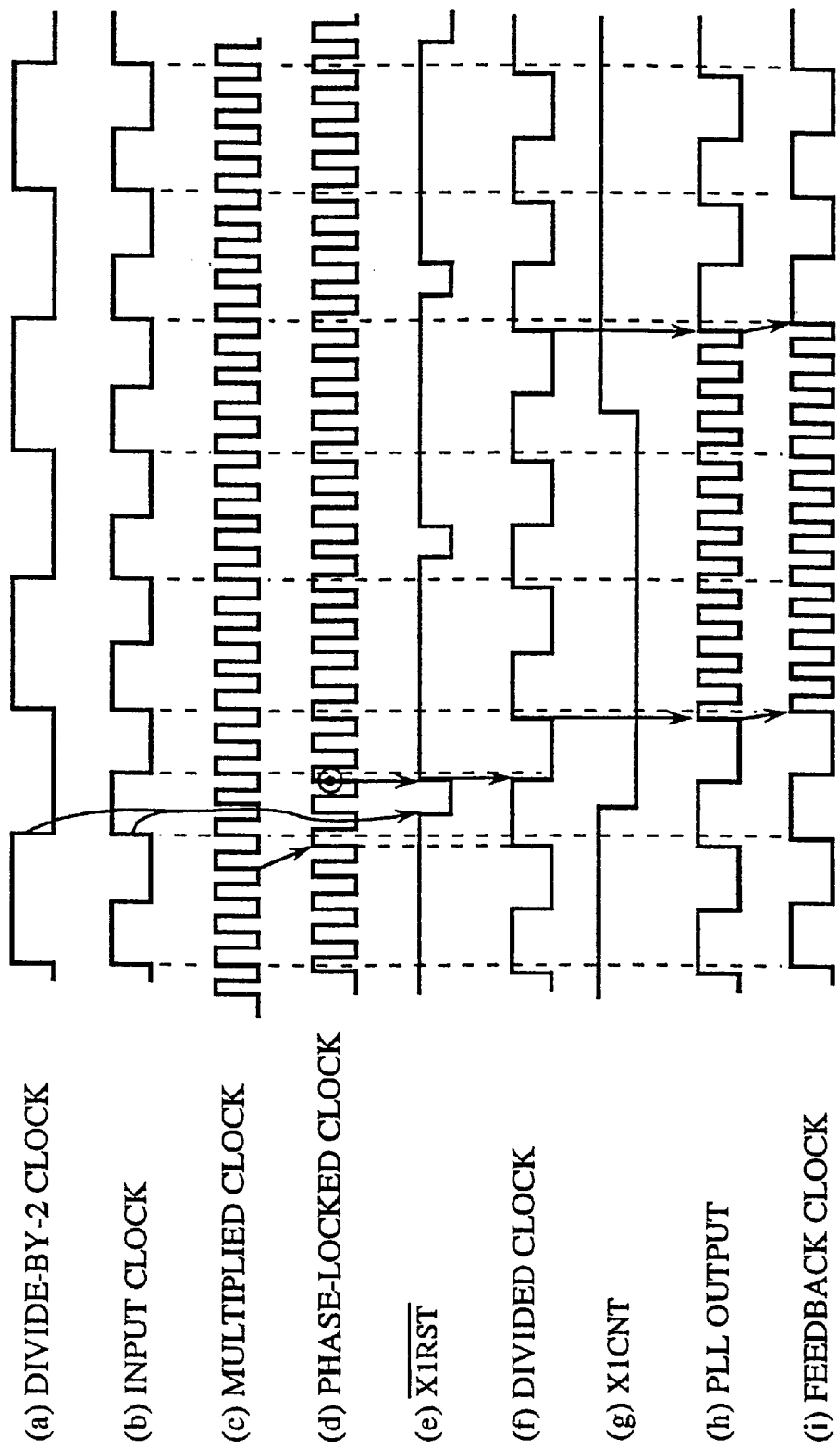
FIGS. 9a–9i are a timing chart illustrating the overall operation of the embodiment 1.
Figure 10:
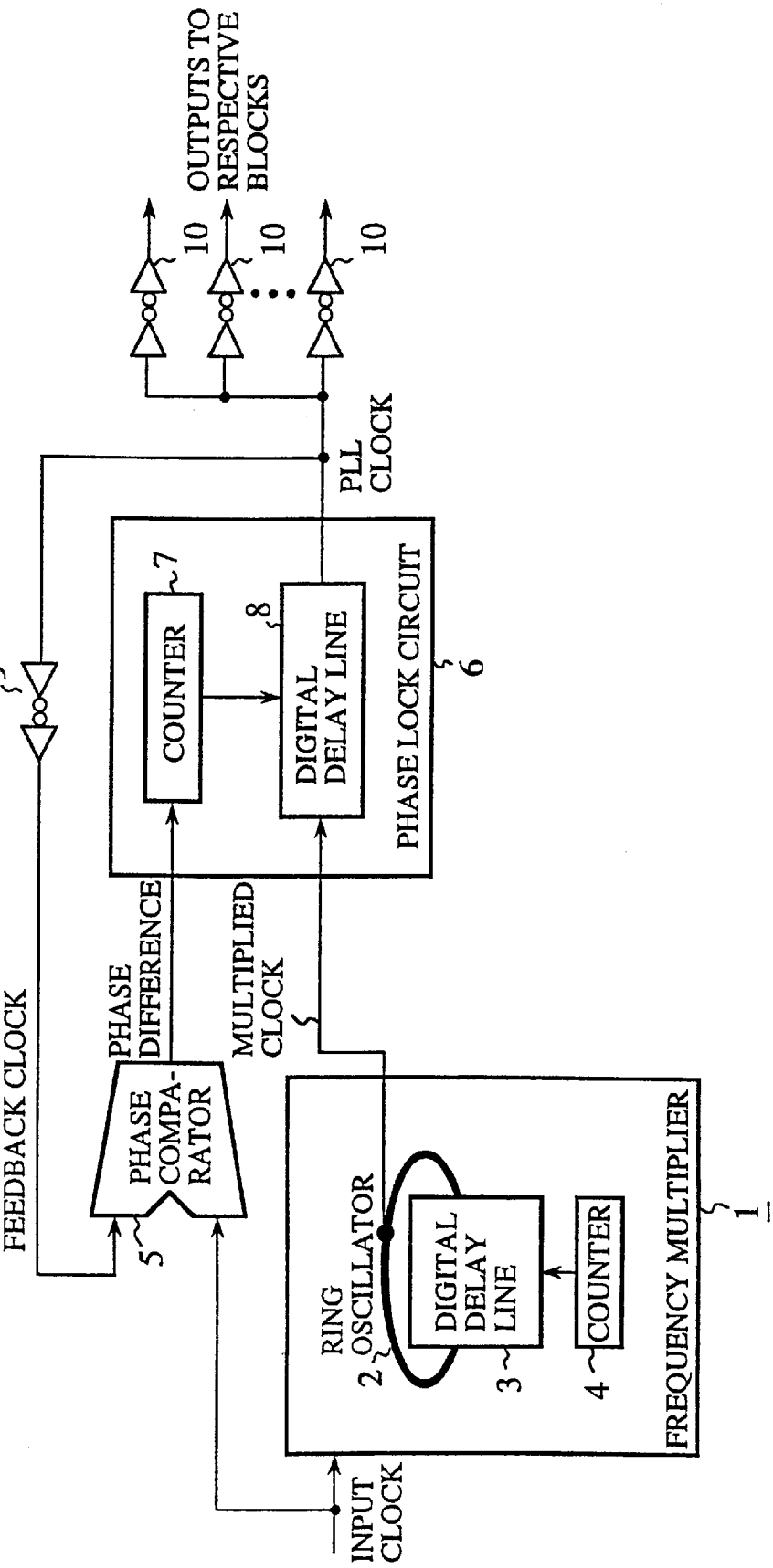
FIG. 10 is a block diagram showing a conventional clock generator.
Figure 11:
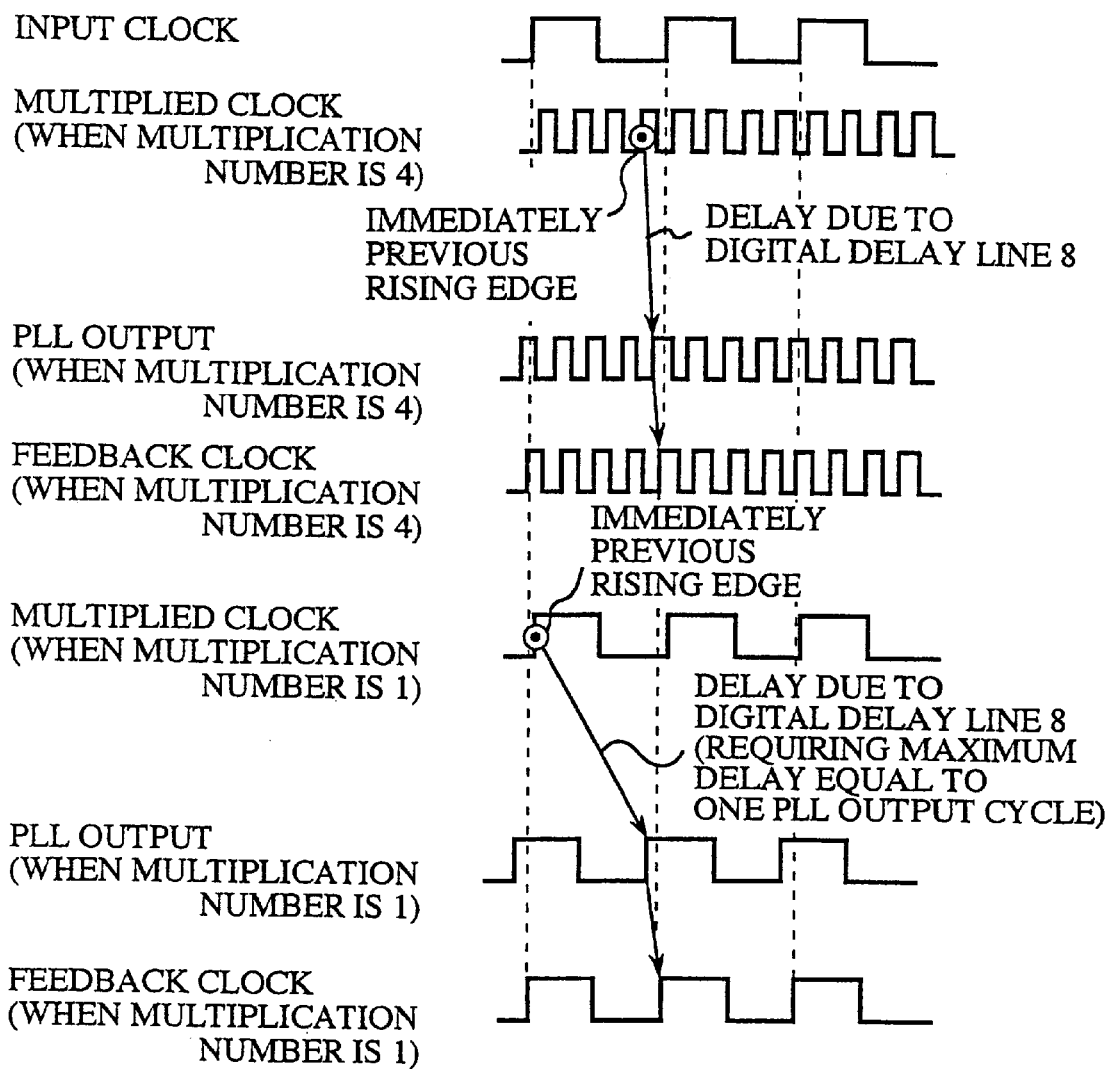
FIG. 11 is a timing chart illustrating various signals in the conventional clock generator.

In the frequency divider 13 as shown in FIGS. 1 and 2, the reference numeral 39 designates a shift register for detecting, from among the phase-locked clock pulses output from the phase lock circuit 12, the phase-locked clock pulse immediately previous to the falling edge of every other pulse of the input clock signal, and for producing an X1RST signal in response to that phase-locked clock pulse (see, FIG. 9); 40 designates a divide-by-4 circuit for quartering the frequency of the phase-locked clock signal from a time at which the shift register 39 outputs the X1RST signal; 41 designates fixed delay elements for providing the phase-locked clock pulses output from the phase lock circuit 12 with a delay corresponding to the delay of the divide-by-4 circuit 40; 42 designates a selector for selecting, when the multiplication number switching signal X1CNT is H level, the divide-by-4 clock signal output from the divide-by-4 circuit 40 as the PLL output, and for selecting, when the multiplication number switching signal X1CNT is L level, the phase-locked clock signal output from the delay elements 41 as the PLL output; 43 designates a driver for supplying the phase comparator 32 with the PLL output produced from the selector 42 as the feedback clock signal; and each reference numeral 44 designates a driver for supplying respective blocks with the PLL output produced from the selector 42.

Figure 3:
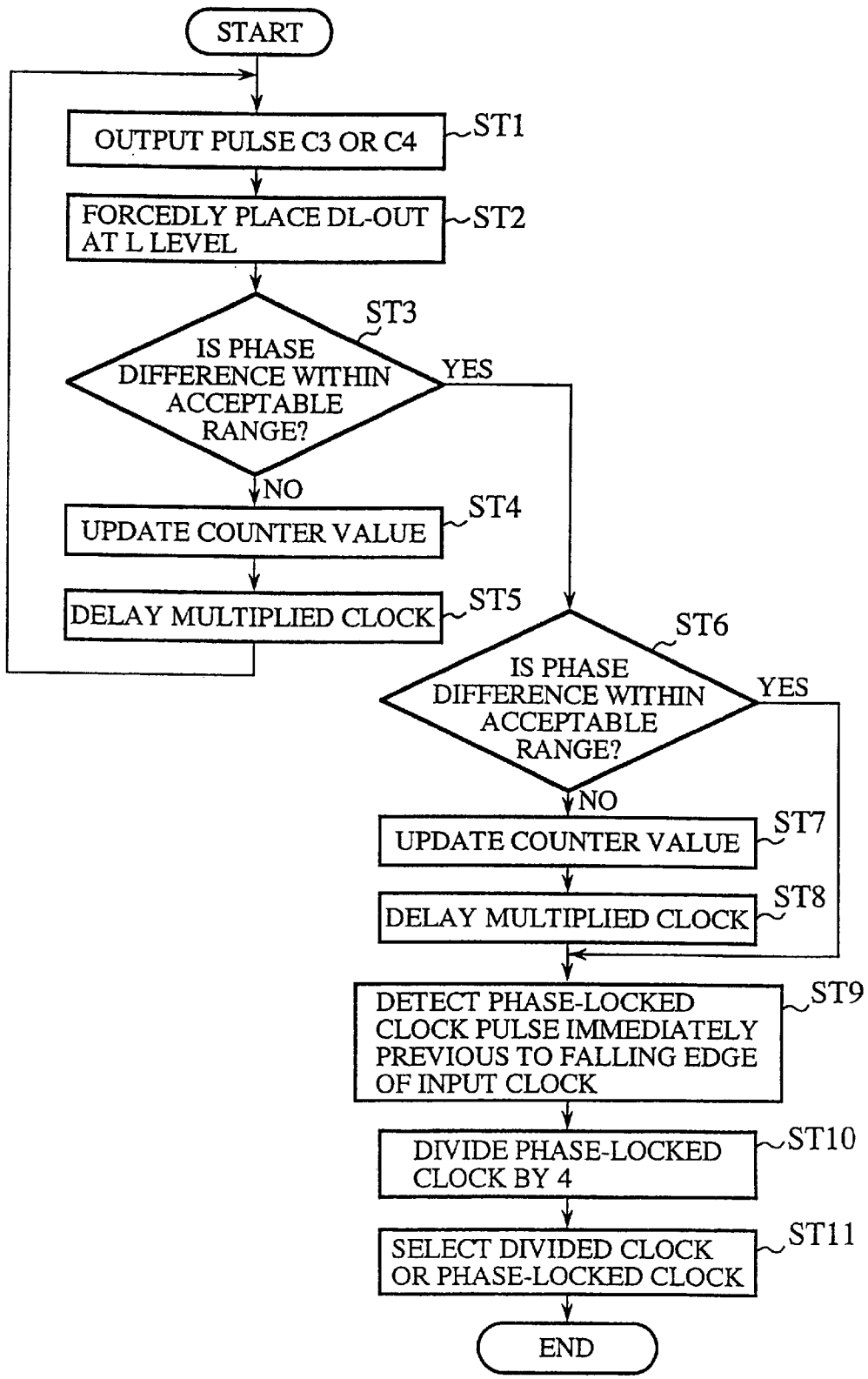
FIG. 3 is a flowchart illustrating a clock generating method in the embodiment 1.

Next, the operation of the present embodiment 1 will be described with reference to the flowchart of FIG. 3 illustrating the clock generating method of the present embodiment 1.

First, at step ST1, the pulse counter 14 of the frequency multiplier 11 outputs, when the SR flip-flip 16 outputs the DL-ACT signal of H level, the pulse C3 at the third pulse of the DL-OUT signal from the rising edge of each pulse of the input clock signal, and the pulse C4 at the fourth pulse as shown in FIG. 4.

The multiplication number switching circuit 15 selects, when the multiplication number switching signal X3CNT is H level, the pulse C3 and outputs it with blocking the pulse C4 to multiply the frequency of the input clock signal by three. In contrast, when the multiplication number switching signal X3CNT is L level, the multiplication number switching circuit 15 selects the pulse C4 and outputs it with blocking the pulse C3 to multiply the frequency of the input clock signal by four.

The SR flip-flip 16 shifts, at the rising edge of each pulse of the input clock signal, the DL-ACT signal to H level to start the oscillation of the frequency multiplied clock signal, and changes, when the multiplication number switching circuit 15 outputs the pulse C3 or C4, the DL-ACT signal to L level because the intended multiplication number is achieved.

When the DL-ACT signal is placed at L level, the AND gate 30 closes the ring oscillator, causing the DL-OUT (frequency multiplied clock signal) to be forcedly placed at L level as shown in FIG. 4 (step ST2). If the frequency multiplied clock signal is unduly delayed, the SR flip-flop 17 forcedly shifts the DL-OUT signal to H level.

On the other hand, when the divide-by-2 circuit 20 generates the divide-by-2 clock signal by halving the frequency of the input clock signal, the phase comparator 21 compares the phase of the divide-by-2 clock signal with that of the frequency multiplied clock signal output from the AND gate 30, and decides whether the phase difference is within the accepted range or not at step ST3, in order to synchronize these phases.

If the phase difference is within the accepted range, the phase comparator 21, making a decision that the phase of the frequency multiplied clock signal is aligned with that of the divide-by-2 clock signal, supplies the lock detector 31 with a lock detection signal, and maintains the counter value of the counter 22, thereby holding the delay time of the ring oscillator.

If the phase difference goes out of the accepted range again owing to an effect of temperature or the like after the lock detection signal has been output, a step is taken to cancel the phase difference as in the case where the phase difference is out of the accepted range, which will be described below. However, once the lock detection signal has been output, the PLL output is not halted until the OR gate 19 outputs the PLL-Reset signal.

If the phase difference is out of the accepted range, the phase comparator 21, making a decision that the phase of the frequency multiplied clock signal disagrees with that of the divide-by-2 clock signal, supplies the counter 22 with the up signal or down signal to update the counter value at step ST4. Receiving the up signal from the phase comparator 21, the counter 22 increments the counter value by one, whereas receiving the down signal, it decrements the counter value by one.

Then, the decoder 23 decodes the upper seven bits of the counter value, and outputs the 96-bit control signal to cause the phase of the frequency multiplied clock signal to coarsely approach that of the divide-by-2 clock signal. On the other hand, the decoder 24 decodes the lower three bit of the counter value, and outputs the 8-bit control signal to reduce the phase difference to a least possible value.

Figure 5:
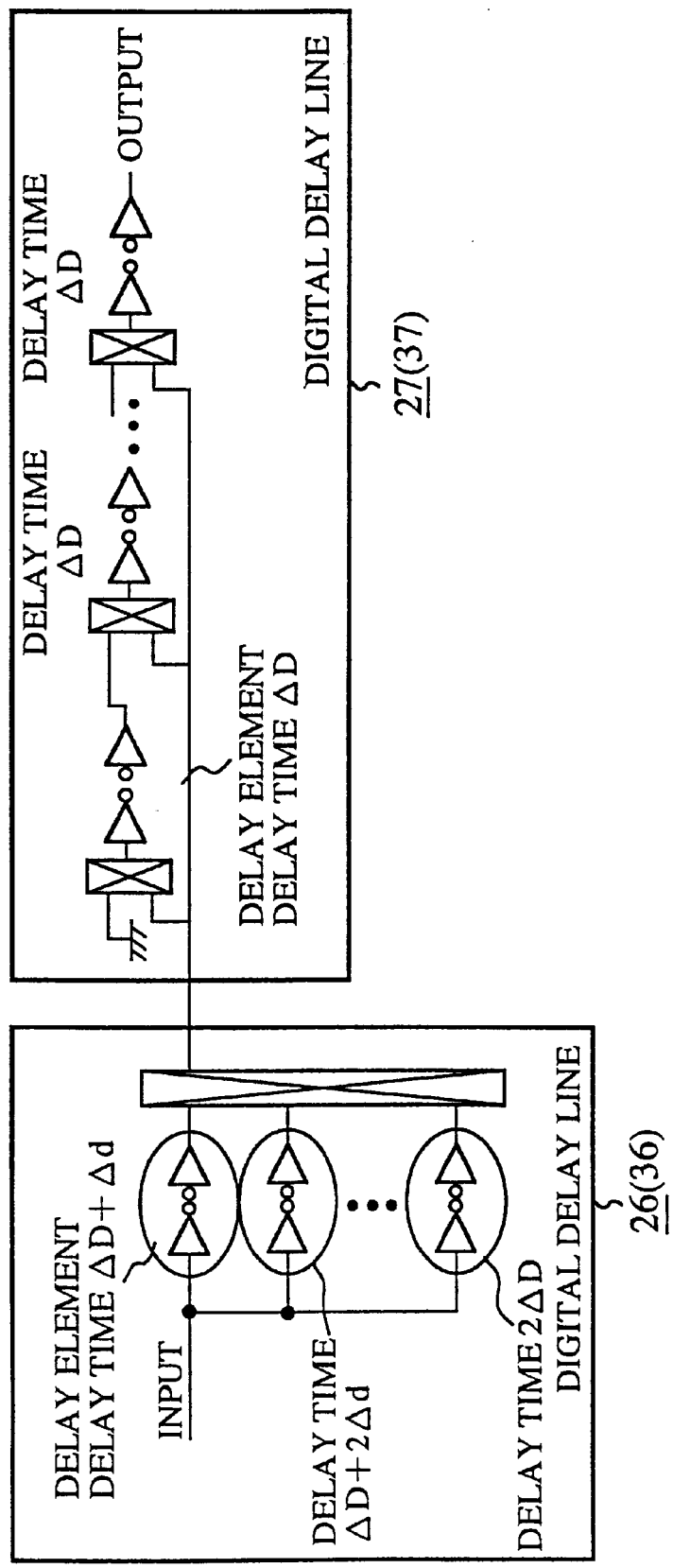
FIG. 5 is a block diagram showing detailed arrangement of digital delay lines 26 and 27 of the embodiment 1.

Thus, in response to the 8-bit control signal output from the decoder 24, the digital delay line 26 finely delays the frequency multiplied clock signal at step ST5. As shown in FIG. 5, the digital delay line 26 consists of eight delay elements that provide slightly different delay times and are connected in parallel, and hence can achieve fine adjustment of the delay time.

On the other hand, in response to the 96-bit control signal output from the decoder 23, the digital delay line 27 coarsely delays the frequency multiplied clock signal at step ST5. As shown in FIG. 5, the digital delay line 27 consists of 96 delay elements connected in series, each of which provides a delay time of $\Delta D$, and the delay element selected by the counter value captures the frequency multiplied clock signal into the digital delay line 27. Thus, the input position of the frequency multiplied clock signal is changed to control the delay time of the digital delay line 27 at 96 steps.

The counter value of the counter 22 is initially set at one (the minimum delay time), and is incremented by one at every two cycles of the input clock signal. Thus, the delay time due to the digital delay lines 26 and 27 gradually increases from the minimum delay time as shown in FIG. 4, and the counter value is locked at a point where the rising edge of the input clock signal is synchronized with that of the frequency multiplied clock signal.

Since the maximum delay time of the ring oscillator is set at half a period of the frequency multiplied clock signal, the number of the delay elements can be decreased by reducing the period of the frequency multiplied clock signal by increasing the multiplication number.

The phase lock circuit 12 starts its operation in response to the lock detection signal output from the lock detector 31. To synchronize the phase of the feedback clock signal output from the driver 43 with that of the input clock signal, the phase comparator 32 compares the phase of the input clock signal with that of the feedback clock signal, and makes a decision as to whether the phase difference is within the acceptable range at step ST6.

If the phase difference is within the accepted range, the phase comparator 32, making a decision that the phase of the feedback clock signal is aligned with that of the input clock signal, maintains the counter value of the counter 33, thereby holding the delay time of the digital delay lines 36 and 37.

In contrast, if the phase difference is out of the accepted range, the phase comparator 32, making a decision that the phase of the feedback clock signal disagrees with that of the input clock signal, supplies the counter 33 with the up signal or down signal to update the counter value at step ST7. Receiving the up signal from the phase comparator 32, the counter 33 increments the counter value by one, whereas receiving the down signal, it decrements the counter value by one. In this case, the counter 33 is initially set at a value obtained by performing a predetermined calculation on the counter value of the counter 22 at the time when the lock detection signal is output.

Then, the decoder 34 decodes the upper five bits of the counter value of the counter 33, and outputs the 32-bit control signal to cause the phase of the feedback clock signal to coarsely approach that of the input clock signal. On the other hand, the decoder 35 decodes the lower three bit of the counter value of the counter 33, and outputs the 8-bit control signal to reduce the phase difference to a least possible value.

In response to the 8-bit control signal output from the decoder 35, the digital delay line 36 finely delays the frequency multiplied clock signal at step ST8. Since the arrangement of the digital delay line 36 is the same as that of the digital delay line 26, the description thereof is omitted here.

On the other hand, in response to the 32-bit control signal output from the decoder 34, the digital delay line 37 coarsely delays the frequency multiplied clock signal at step ST8. Since the arrangement of the digital delay line 37 is the same to that of the digital delay line 27 except for the number of stages of the delay elements, the description thereof is omitted here.

Although the maximum delay time of the ring oscillator in the frequency multiplier 11 is set at half the period of the frequency multiplied clock signal as described above, the maximum delay time of the digital delay lines 36 and 37 is one period of the frequency multiplied clock signal, which means that twice the number of the delay elements are required if the digital delay lines 36 and 37 are arranged using the same delay elements as those of the digital delay lines 26 and 27 of the ring oscillator.

In view of this, the delay times of the delay elements of the digital delay lines 36 and 37 are adjusted such that they become larger than those of the digital delay line 26 and 27.

Figure 6:
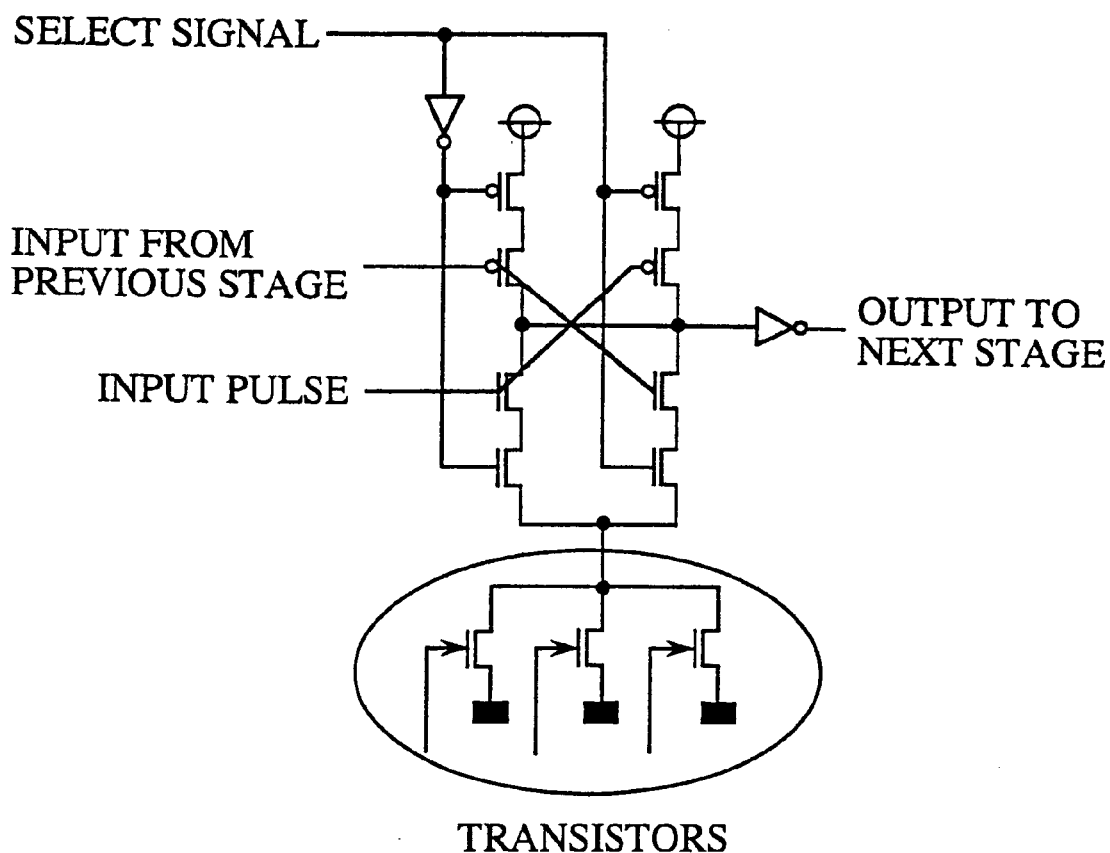
FIG. 6 is a circuit diagram showing an arrangement of a delay element of the digital delay line.
Figure 8:
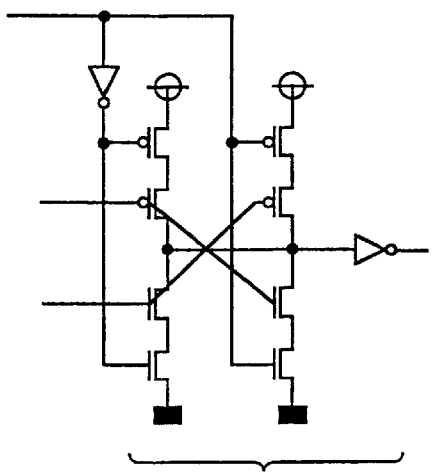
FIG. 8 is a circuit diagram showing still another arrangement of the delay element.

To increase the delay time, the gate length of the transistors is lengthened or the gate width is narrowed as shown in FIG. 8. Alternatively, as shown in FIG. 6, when N-channel CMOS transistors are employed, the delay time is controlled by changing their current by adjusting the gate voltage of N-channel transistors encircled in FIG. 6.

Figure 7:
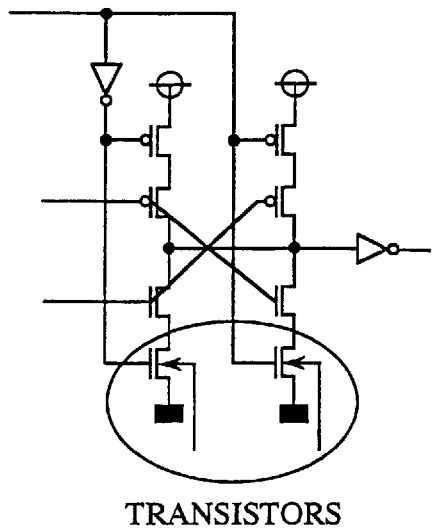
FIG. 7 is a circuit diagram showing another arrangement of the delay element.

Otherwise, as shown in FIG. 7, the delay time can be controlled by varying the current of the N-channel CMOS transistors by adjusting the backgate voltage of the transistors encircled in FIG. 7.

The frequency divider 13 divides the frequency of the phase-locked clock signal output from the phase lock circuit 12, with synchronizing the phase of the PLL output signal to that of the input clock signal. To achieve this, in response to the rising edge of each pulse of the phase-locked clock signal, the shift register 39, which mainly consists of a chain of flip-flops connected in cascade as shown in FIG. 2, transfers the divide-by-2 clock signal step by step in response to the phase-locked clock signal in order to change the signal level of the inverted X1RST signal to H level at the rising edge of the pulse of the phase-locked clock signal immediately previous to the falling edge of every other pulse of the input clock signal as shown in FIGS. 9(b), (d) and (e).

Receiving the inverted X1RST signal from the shift register 39, the divide-by-4 circuit 40 divides the frequency of the phase-locked clock signal by four using the rising edge of the inverted X1RST signal as a reference, and generates the frequency divided clock signal at step ST10 (see, FIGS. 9(e) and (f)).

The selector 42 selects, when the multiplication number switching signal X1CNT signal is H level, the frequency divided clock signal output from the divide-by-4 circuit 40 as the PLL output, or selects, when the multiplication number switching signal X1CNT signal is L level, the phase-locked clock signal output from the fixed delay elements 41 as the PLL output at step ST11. The fixed delay elements 41 provide the phase-locked clock signal with the delay identical to that of the divide-by-4 circuit 40 to align the phase of the phase-locked clock signal with that of the frequency divided clock signal. Thus, the PLL output produced from the selector 42 is delivered to respective blocks through the drivers 44, and is fed back to the phase comparator 32 as the feedback clock signal.

As described above, the present embodiment 1 is arranged such that the phase-locked clock signal undergoes the frequency division using as the reference the detection point of the phase-locked clock pulse that is selected from among the pulses of the phase-locked clock signal output from the phase lock circuit 12, and positioned immediately previous to the falling edge of the every other pulse of the input clock signal. This makes it possible to limit the phase difference between the feedback clock signal (frequency divided clock signal) and the input clock signal within one period of the frequency multiplied clock signal, which offers an advantage of being able to produce the PLL output with the reduced multiplication number (that is, with a low frequency) without increasing the number of delay elements.

EMBODIMENT 2

Although the phase-locked clock signal is divided by four to generate the PLL output with the same period as that of the input clock signal in the foregoing embodiment 1, this is not essential. For example, the frequency multiplied clock signal multiplied by n may be generated and be divided by m to produce n/m PLL output, where n and m are natural numbers.

Replacing the divide-by-4 circuit 40 with a divide-by-m circuit can limit the length of the digital delay lines 36 and 37 in the phase lock circuit 12 within 1/m of the period of the PLL output.

What is claimed is:

1. A clock generator comprising:

a frequency multiplier for generating a frequency multiplied clock signal by multiplying a frequency of an input clock signal;

a phase lock circuit for detecting a phase difference between said input clock signal and a frequency divided clock signal, and for generating, by delaying said frequency multiplied clock signal by an amount corresponding to said phase difference, a phase-locked clock signal with its phase locked with said input clock signal; and a frequency divider for detecting in a fixed cycle a particular pulse of said phase-locked clock signal, and for generating said frequency divided clock signal by dividing frequency of said phase-locked clock signal with reference to said particular pulse of said phase-locked clock signal.

2. The clock generator as claimed in claim 1, wherein said frequency divider detects said particular pulse at every one or more cycles of said input clock signal, and said particular pulse of said phase-locked clock signal is a pulse immediately previous to a falling edge of said input clock signal.

3. The clock generator as claimed in claim 1, wherein said frequency divider comprises a frequency dividing circuit for dividing the frequency of said phase-locked clock signal, and a delay circuit for providing said phase-locked clock signal with a delay of said frequency dividing circuit.

4. The clock generator as claimed in claim 3, wherein said frequency divider comprises a selector for selecting, as an output of said frequency divider, one of said frequency divided clock signal generated by said frequency dividing circuit and said phase-locked clock signal with its phase delayed by said delay circuit.

5. The clock generator as claimed in claim 1, wherein said frequency multiplier switches a multiplication number of said frequency multiplied clock signal in response to a multiplication number switching signal.

6. The clock generator as claimed in claim 5, wherein said frequency multiplier comprise:

a ring oscillator for generating said frequency multiplied clock signal;

a counter for counting a number of pulses of said frequency multiplied clock signal; and a halt circuit for suspending generation of said frequency multiplied clock signal by said ring oscillator when the number of pulses of said frequency multiplied clock signal counted by said counter agrees with the multiplication number.

7. The clock generator as claimed in claim 6, wherein said frequency multiplier generates an n-multiplied clock signal as said frequency multiplied clock signal, and said frequency divider divides said phase locked clock signal by m, where n and m are natural numbers greater than one.

8. The clock generator as claimed in claim 7, wherein said ring oscillator controls its delay time using a digital delay line including one or more transistors with their current variable by changing their gate voltage.

9. The clock generator as claimed in claim 7, wherein said ring oscillator controls its delay time using a digital delay line including one or more transistors with their current variable by changing their backgate voltage.

10. The clock generator as claimed in claim 1, wherein said phase lock circuit controls its delay time using a digital delay line including one or more transistors with their current variable by changing their gate voltage.

11. The clock generator as claimed in claim 1, wherein said phase lock circuit controls its delay time using a digital delay line including one or more transistors with their current variable by changing their backgate voltage.

12. A clock generating method comprising the steps of:
(a) generating a frequency multiplied clock signal by multiplying a frequency of an input clock signal;
(b) detecting a phase difference between said input clock signal and a frequency divided clock signal, and generating, by delaying said frequency multiplied clock signal by an amount corresponding to said phase difference, a phase-locked clock signal with its phase locked with said input clock signal; and
(c) detecting in a fixed cycle a particular pulse of said phase-locked clock signal, and generating said frequency divided clock signal by dividing said phase-locked clock signal with reference to said particular pulse of said phase-locked clock signal.

13. The clock generating method as claimed in claim 12, wherein said step (c) detects said particular pulse at every one or more cycles of said input clock signal, and said particular pulse of said phase-locked clock signal is a pulse immediately previous to a falling edge of said input clock signal.

14. The clock generating method as claimed in claim 12, wherein said step (a) switches a multiplication number of said frequency multiplied clock signal in response to a multiplication number switching signal.

* * * * *